(12) United States Patent
Park

(10) Patent No.: US 7,863,073 B2
(45) Date of Patent: Jan. 4, 2011

(54) IMAGE SENSOR AND METHOD FOR MANUFACTURING THE SAME

(75) Inventor: Kyung Min Park, Incheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/179,607

(22) Filed: Jul. 25, 2008

(65) Prior Publication Data

US 2009/0032895 A1  Feb. 5, 2009

(30) Foreign Application Priority Data

Aug. 2, 2007  (KR) .................. 10-2007-0077672

(51) Int. Cl.
 *H01L 21/00* (2006.01)
(52) U.S. Cl. .................. 438/57; 438/66; 438/70; 438/98; 257/E31.121; 257/E31.124; 257/E31.127
(58) Field of Classification Search ............... None
 See application file for complete search history.

(56) References Cited

U.S. PATENT DOCUMENTS

| 7,253,018 | B2* | 8/2007 | Kim | 438/57 |
| 7,294,524 | B2* | 11/2007 | Park | 438/57 |
| 2007/0161147 | A1* | 7/2007 | Kim | 438/70 |

FOREIGN PATENT DOCUMENTS

| KR | 10-2004-0059459 | 2/2006 |
| KR | 10-2004-0112057 | 6/2006 |
| KR | 10-2005-0100204 | 3/2007 |

* cited by examiner

*Primary Examiner*—Zandra Smith
*Assistant Examiner*—Khanh B Duong
(74) *Attorney, Agent, or Firm*—Saliwanchik, Lloyd & Saliwanchik

(57) ABSTRACT

An image sensor and a method for manufacturing the same are provided. The image sensor comprises at least one unit pixel, an interlayer dielectric, a color filter, a planarization layer, and a microlens. The microlens has a smooth surface after performing a plasma treatment process.

10 Claims, 4 Drawing Sheets

IMAGE SENSOR AND METHOD FOR MANUFACTURING THE SAME

CROSS-REFERENCE TO RELATED APPLICATION

The present application claims the benefit under 35 U.S.C. §119(e) of Korean Patent Application No. 10-2007-0077672, filed Aug. 2, 2007, which is hereby incorporated by reference in its entirety.

BACKGROUND

An image sensor is typically classified as a charge coupled device (CCD) or a complementary metal oxide semiconductor (CMOS) image sensor (CIS).

The CIS generally includes photodiodes and MOS transistors in unit pixels. The CIS sequentially detects electrical signals of respective unit pixels in a switching manner to realize an image.

A microlens is typically formed on a color filter to enhance the light sensitivity of the CIS. Generally, the microlens is formed in a domed shape by sequentially performing an exposure process, a development process, and a reflow process with respect to a photosensitive organic material.

However, since the photosensitive organic material has weak physical properties, the microlens may be damaged by physical impact after being formed such as during a packaging process or a bump process. Also, since the photosensitive organic material has relatively high viscosity, a defect may be generated in the microlens from particles adsorbing thereon.

Thus, there exists a need in the art for an improved image sensor and method for manufacturing the same.

BRIEF SUMMARY

Embodiments of the present invention provide an image sensor and a method for manufacturing the same that can inhibit damage from particles and/or cracks by incorporating a microlens comprising an inorganic material.

In an embodiment, an image sensor can comprise: at least one unit pixel on a semiconductor substrate; an interlayer dielectric on the semiconductor substrate; a color filter on the interlayer dielectric; a planarization layer on the color filter; and a microlens on the planarization layer, wherein the microlens comprises an inorganic material having a smoothed surface.

In another embodiment, a method for manufacturing an image sensor can comprise: forming at least one unit pixel in a semiconductor substrate; forming an interlayer dielectric on the semiconductor substrate; forming a color filter on the interlayer dielectric; forming a planarization layer on the color filter; forming a microlens on the planarization layer; and performing a plasma treatment process on the microlens.

The details of one or more embodiments are set forth in the accompanying drawings and the description below. Other features will be apparent to one of ordinary skill in the art from the detailed description, the drawings, and the claims.

DETAILED DESCRIPTION

When the terms "on" or "over" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

Reference will now be made in detail to embodiments of the present invention, examples of which are illustrated in the accompanying drawings.

Figure 8:
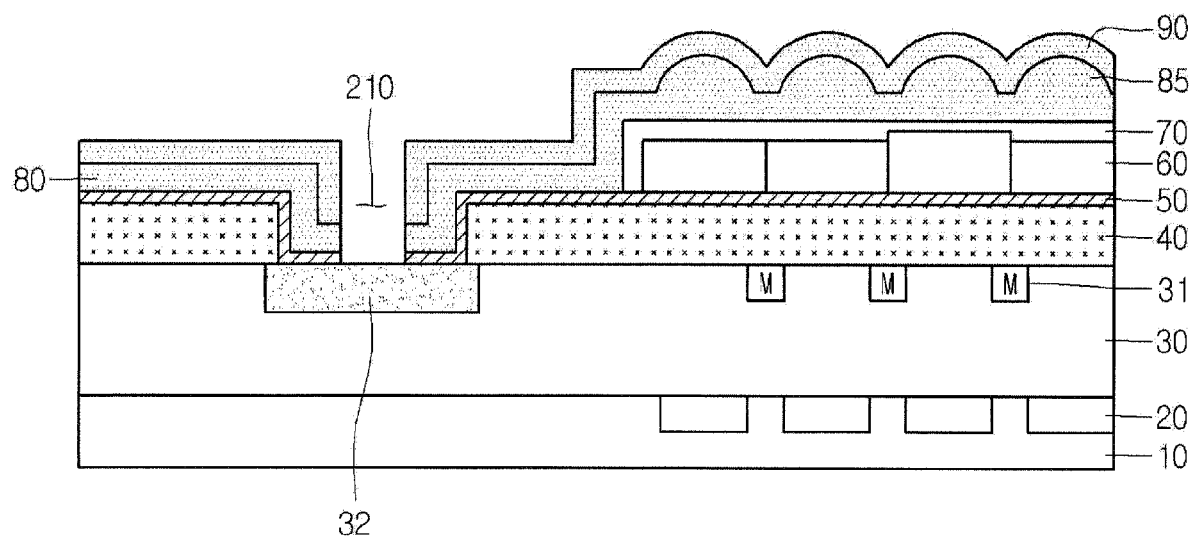

FIG. 8 is a cross-sectional view illustrating an image sensor according to an embodiment of the present invention.

Referring to FIG. 8, at least one unit pixel 20 can be disposed on a semiconductor substrate 10.

Each unit pixel 20 can include a photodiode (not shown) and a complementary metal oxide semiconductor (CMOS) circuit (not shown).

An interlayer dielectric 30 can be disposed on the semiconductor substrate 10. The interlayer dielectric 30 can include metal interconnections 31 and a pad 32. The metal interconnections 31 and the pad 32 can be formed of a metal.

Though the figures show one interlayer dielectric 30 and one layer of metal interconnections 31, embodiments of the present invention are not limited thereto. For example, a plurality of interlayer dielectrics 30 can be provided. Also, a plurality of layers of metal interconnections 31 can be provided.

A passivation layer 40 can be disposed on the interlayer dielectric 30. The passivation layer 40 can be disposed such that at least a portion of the metal pad 32 is not under the passivation layer 40. The passivation layer 40 can be formed of any suitable material known in the art. For example, the passivation layer 40 can be a nitride layer, an oxide layer, or an oxide nitride layer. In an embodiment, the passivation layer 40 can include multiple layers, such as a nitride layer, an oxide layer and an oxide nitride layer.

A tetraethyl orthosilicate (TEOS) layer 50 can be disposed on the passivation layer 40 and the pad 32. The TEOS layer 50 can have a thickness that is less than that of the passivation layer 40. In an embodiment, no TEOS layer 50 is included in the image sensor.

At least one color filter 60 can be disposed on the passivation layer 40. In an embodiment, a color filter 60 is disposed for every unit pixel 20 to help separate color from incident light. Each color filter 60 can be a red color filter, a green color filter, or a blue color filter. Adjacent color filters 60 can have different thicknesses.

For embodiments where the top surfaces of the color filters 60 are different heights, a planarization layer 70 can be disposed on the color filter 60. The planarization layer 70 can be formed of any suitable material known in the art, for example, an organic material.

At least one microlens 85 can be disposed on the planarization layer 70. For example, a microlens 85 can be disposed on the planarization layer for each unit pixel 20. The microlens 85 can be formed of, for example, a low temperature oxide layer.

In an embodiment, the microlens 85 can have a smooth surface. According to embodiments, the surface of the microlens 85 can have reduced roughness. In a specific embodiment, the surface roughness can be smoothed through a plasma treatment process.

To inhibit the microlens 85 from being separated from adjacent microlenses 85 (i.e. to create a "zero-gap" microlens), an inorganic material layer 90 can be disposed on the microlens 85. The inorganic material layer 90 can be, for example, a low temperature oxide layer.

The inorganic material layer 90 can be disposed on the microlens 85 in order to remove any gaps between adjacent microlenses 85. Accordingly, crosstalk and noise of the image sensor can be inhibited.

Additionally, in an embodiment, the surface of the microlens 85 can be formed in a domed shape to improve light transmittance, thereby improving the image characteristics of the image sensor.

FIGS. 1 to 8 are cross-sectional views illustrating a process of manufacturing an image sensor according to embodiments of the present invention.

Figure 1:
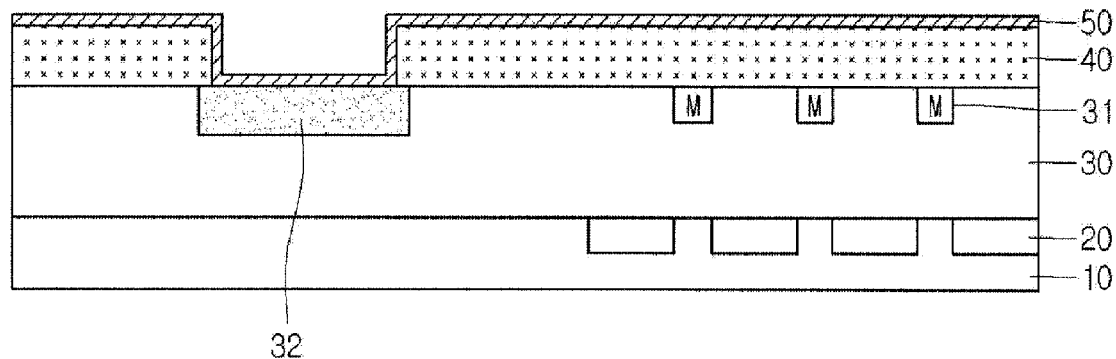
FIGS. 1 to 8 are cross-sectional views illustrating a method of manufacturing an image sensor according to embodiments of the present invention.

Referring to FIG. 1, at least one unit pixel 20 can be formed in a semiconductor substrate 10.

A device isolation layer (not shown) defining an active region and a field region can be formed in the semiconductor substrate 10. A unit pixel 20 formed in the active region can include a photodiode for receiving light to generate a photo charge and a CMOS circuit (not shown) connected to the photodiode for converting the generated photo charge into an electrical signal.

Metal interconnections 31 and an interlayer dielectric 30 can be formed on the semiconductor substrate 10.

In an embodiment, the interlayer dielectric 30 can be formed in multiple layers. In addition, the interlayer dielectric 30 can include one or more nitride and oxide layers.

The metal interconnections 31 pass through the interlayer dielectric 30 and can be formed at the same time through, for example, a damascene process. The metal interconnections 31 can be arranged such that they are not directly over any unit pixel 20. Such an arrangement can help inhibit screening of light incident to the photodiode. Though the figures show one layer of metal interconnections 31, embodiments of the present invention are not limited thereto. For example, a plurality of layers of metal interconnections 31 can be provided. A pad 32 can also be formed in the interlayer dielectric 30. In an embodiment, the pad 32 can be simultaneously formed while forming the uppermost metal connections 31.

A passivation layer 40 can be formed on the interlayer dielectric 30. The passivation layer 40 can be designed for protecting a device from moisture and scratching. The passivation layer 40 can be formed of any suitable material known in the art, such as a dielectric layer. In certain embodiments, the passivation layer 40 can be an oxide layer, a nitride layer, or an oxide nitride layer. In an alternative embodiment, the passivation layer 40 can have a multi-layer structure in which at least one of the layers is stacked. For example, the passivation layer 40 can have a structure in which a TEOS layer having, for example, a thickness of from about 1,000 Å to about 5,000 Å can be stacked with a nitride layer with a thickness of from about 1,000 Å to about 10,000 Å.

The passivation layer 40 can be etched to expose at least a portion of the surface of the pad 32.

Then, a TEOS layer 50 can be formed on the semiconductor substrate 10. The TEOS layer 50 can be designed for protecting the exposed portion of the surface of the pad 32, and can have a thickness of from about 50 Å to about 1000 Å. In certain embodiments, the image sensor can be formed without the TEOS layer 50.

Figure 2:
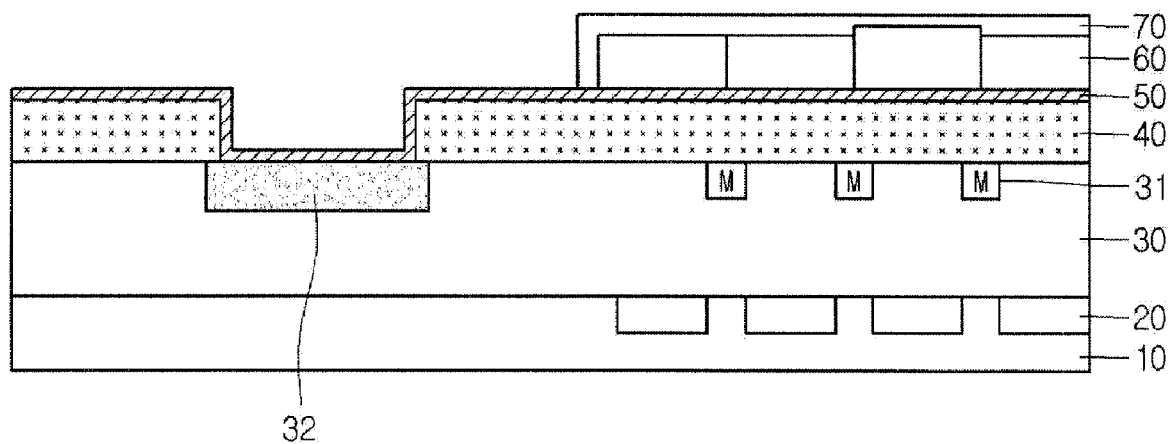

Referring to FIG. 2, at least one color filter 60 can be formed on the passivation layer 40 and the TEOS layer 50 (if present).

The color filter 60 can include a dyed photoresist. In an embodiment, a color filter 60 can be formed for each unit pixel 20 to help separate color from incident light. Each color filter 60 can be a red color filter, a green color filter, or a blue color filter. Adjacent color filters 60 can have different thicknesses.

A planarization layer 70 can be formed on the color filter 60. The planarization layer 70 can help for compensate for any differences in thickness among the color filters 60 since any microlens subsequently formed should be on a planarized surface.

Figure 3:
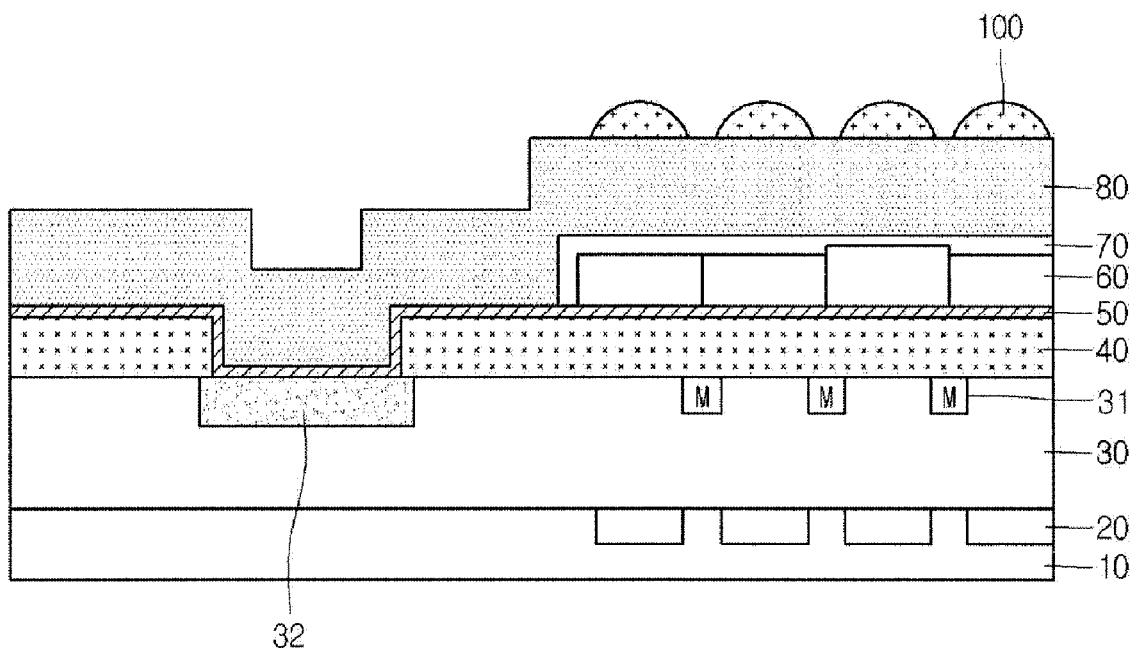

Referring to FIG. 3, a dielectric 80 can be formed on the semiconductor substrate 10 including the planarization layer 70.

The dielectric 80 can be, for example, an oxide layer, a nitride layer, or an oxide nitride layer. In an embodiment, the dielectric 80 can be formed to have a thickness of from about 2,000 Å to about 20,000 Å. In one embodiment, the dielectric 80 can be formed by processing an oxide layer at a temperature of from about 150° C. to about 250° C. using plasma enhanced chemical vapor deposition (PECVD). That is, the dielectric 80 can be a low temperature oxide layer deposited at a low temperature.

Photoresist patterns patterned for each unit pixel 20 can be formed on the dielectric 80, and then at least one dummy microlens 100 can be formed on the dielectric 80. The dummy microlens can be formed, for example, in a domed shape through a reflow process.

Figure 4:
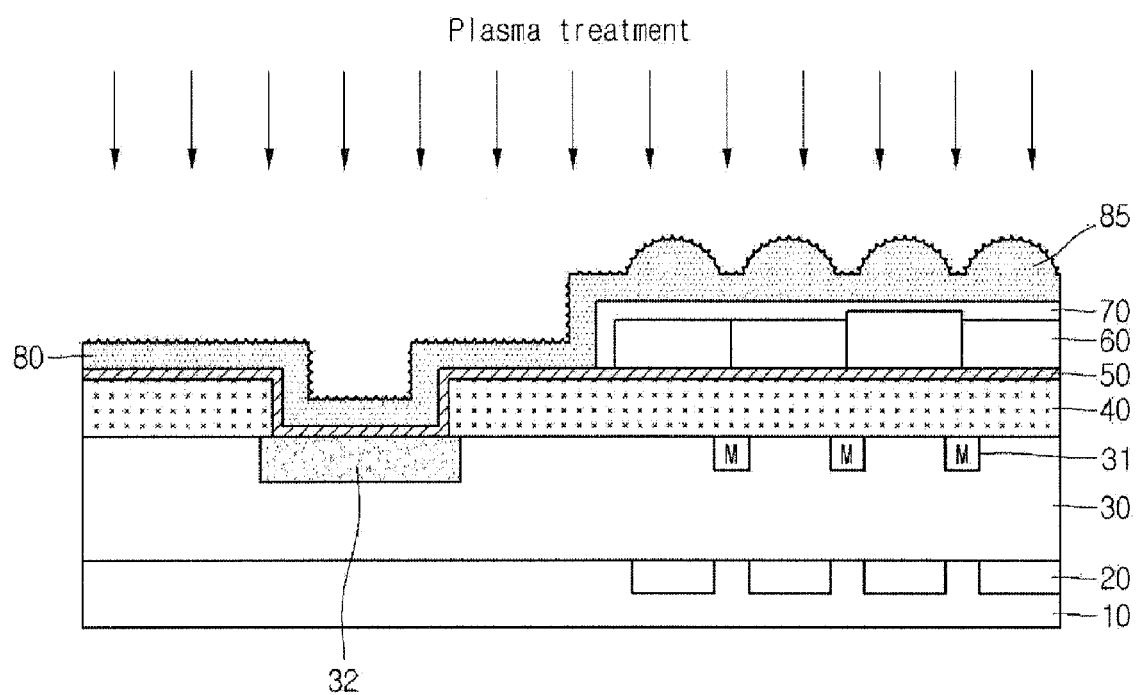

Referring to FIG. 4, at least one microlens 85 can be formed on the planarization layer 70.

The microlens 85 can be formed by dry-etching the dielectric 80 using the dummy microlens 100 as an etch mask. In an embodiment, a microlens 85 formed of the low temperature oxide layer can be formed for each unit pixel 20.

In an embodiment, the etching of the dielectric 80 can be performed until the photoresist forming the dummy microlens 100 is completely removed to form the microlens 85. In an alternative embodiment, to inhibit the merge or bridge phenomenon of the microlens 85, the etching process can be performed such that the dielectric 80 is over-etched.

At this point, the surface of the microlens 85 may be damaged by a reactive ion etching (RIE) process performed to form the microlens 85, and thus the microlens 85 may have an irregular and rough surface.

Referring to FIG. 4, a plasma treatment process can be performed on the microlens 85.

If the surface of the microlens 85 is roughly formed from the etching process, light incident to the microlenses 85 may be undesirably reflected and refracted to deteriorate image characteristics.

Thus, embodiments of the present invention can include performing the plasma treatment process on the microlens 85. For example, the plasma treatment process on the microlens 85 can include supplying an energy of from about 100 W to about 500 W for generating a plasma. $NH_3$ gas, $H_2$ gas, He gas, $N_2$ gas, or any combination thereof can be used during the plasma treatment process, and the plasma treatment process can be performed for a period of time of from about 50 seconds to about 60 seconds.

Figure 5:
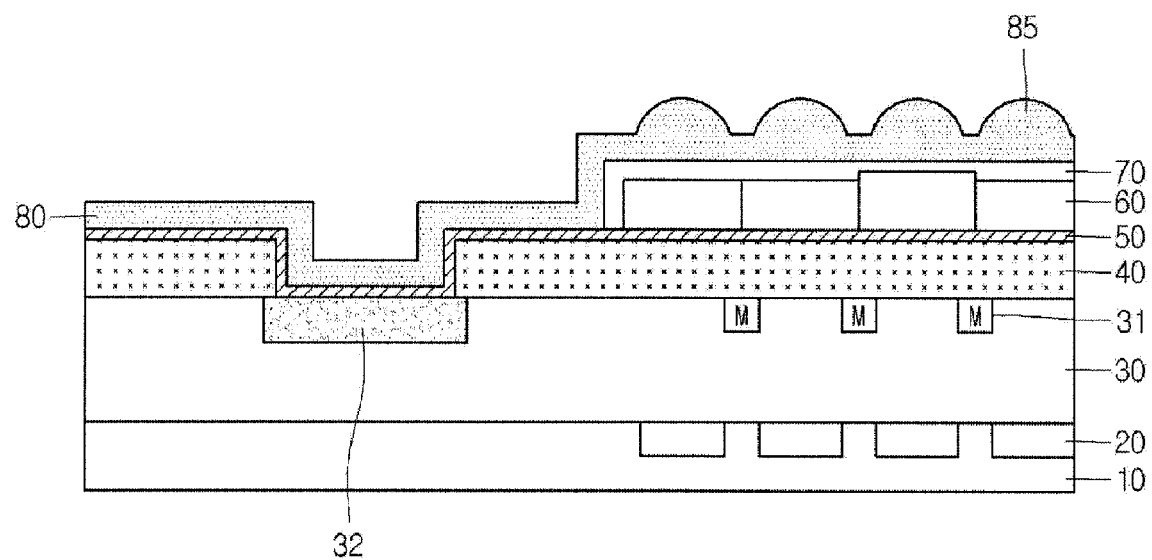

Referring to FIG. 5, the surface of the microlens 85 can be whittled by the ion bombardment of the plasma. Accordingly, the surface of the microlens 85 can be smoothed by the plasma treatment process, so that the microlens 85 can have a smooth surface, thereby enhancing the light transmittance properties of the image sensor.

Figure 6:
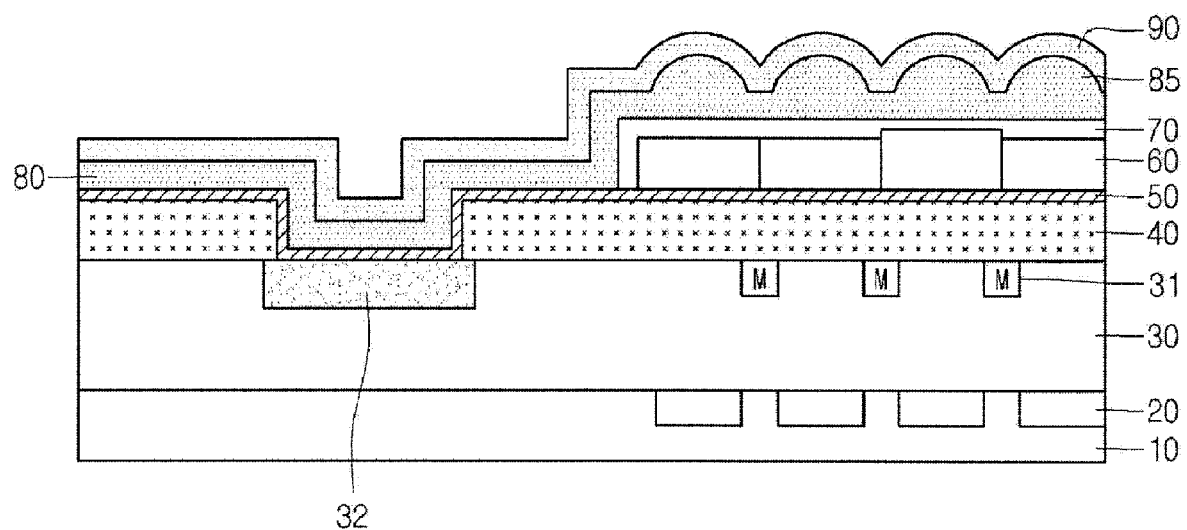

Referring to FIG. 6, an inorganic material layer 90 can be formed on the semiconductor substrate 10 including the microlens 85.

The inorganic material layer 90 can be designed for removing gaps generated between adjacent microlenses 85. The inorganic material layer 90 can be, for example, a low temperature oxide layer.

The inorganic material layer 90 can be deposited on the microlens 85 so that gaps between adjacent microlenses 85 are minimized, thereby improving the quality of the image sensor.

In an embodiment, the inorganic material layer 90 can be formed by depositing a low temperature oxide layer to a thickness of from about 2,000 Å to about 20,000 Å on the microlens 85 and then blanket etching the low temperature oxide layer until the gaps between adjacent microlenses 85 are removed.

In an alternative embodiment, the inorganic material layer 90 can be formed by depositing a low temperature oxide layer to a thickness of from about 100 Å to about 2,000 Å until the gaps between adjacent microlenses 85 are removed.

Figure 7:
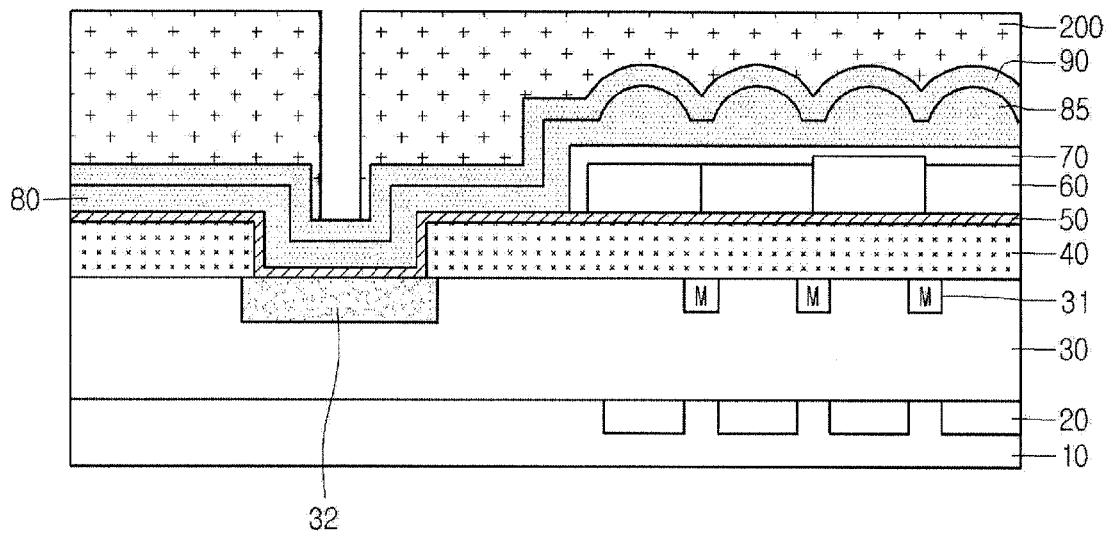

Referring to FIG. 7, a photoresist pattern 200 can be formed on the semiconductor substrate 10 including the microlens 85.

The photoresist pattern 200 can be formed to expose a portion of the inorganic material layer 90 on the upper region of the pad 32 by coating a photoresist layer on the semiconductor substrate 10 including the microlens 85 and performing a lithography process.

Referring to FIG. 8, a pad hole 210 exposing the pad 32 can be formed on the semiconductor substrate 10 on which the microlens 85 is formed.

The pad hole 210 can be formed to expose the pad 32 by etching the inorganic material layer 90, the dielectric 80, and the TEOS layer 50, using the photoresist pattern 200 as an etch mask.

Subsequently, the photoresist pattern 200 can be removed using an ashing process, leaving the microlens 85 on the semiconductor substrate 10 and the pad 32 exposed.

According to embodiments of the present invention, the microlens 85 can be formed using a low temperature oxide layer, thereby inhibiting cracking due to physical impact and consequently enhancing the quality of the image sensor.

Moreover, since the surface of the microlens 85 is smoothed by a plasma treatment process, the light transmittance of the microlens 85 can be enhanced.

In the image sensor and the method for manufacturing the same according to embodiments of the present invention, damage due to particles and cracking can be inhibited by using a microlens formed of inorganic material, thereby improving the quality of the image sensor.

Additionally, the image sensor and the method for manufacturing the same according to the embodiments can reduce the roughness of the surfaces of the microlens, thereby enhancing the light characteristics of the image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
    forming at least one unit pixel in a semiconductor substrate;
    forming an interlayer dielectric on the semiconductor substrate;
    forming a color filter on the interlayer dielectric;
    forming a planarization layer on the color filter;
    forming a microlens on the planarization layer;
    performing a plasma treatment process on the microlens; and
    forming an inorganic material layer on the microlens after performing the plasma treatment process,
    wherein forming the inorganic material layer comprises depositing an oxide layer on the microlens and performing blanket etching on the oxide layer until gaps between the microlens and adjacent microlenses are removed.

2. The method according to claim 1, wherein the microlens comprises an inorganic material.

3. The method according to claim 1, wherein the microlens comprises a low temperature oxide.

4. The method according to claim 1, wherein the plasma treatment process is performed until the microlens has a smooth surface.

5. The method according to claim 1, wherein performing the plasma treatment process on the microlens comprises using $NH_3$ gas, $H_2$ gas, He gas, $N_2$ gas, or any combination thereof.

6. The method according to claim 1, wherein performing the plasma treatment process on the microlens comprises supplying a power of from about 100 W to about 500 W.

7. The method according to claim 1, wherein the plasma treatment process is performed for a period of time of about 50 seconds to about 60 seconds.

8. The method according to claim 1, wherein the inorganic material layer is a low temperature oxide layer.

9. A method for manufacturing an image sensor, comprising:
    forming at least one unit pixel in a semiconductor substrate;
    forming an interlayer dielectric on the semiconductor substrate;
    forming a color filter on the interlayer dielectric;
    forming a planarization layer on the color filter;
    forming a microlens on the planarization layer; and
    performing a plasma treatment process on the microlens;
    wherein forming the microlens comprises:
    depositing an oxide layer on the planarization layer;
    forming a dummy microlens on the oxide layer; and
    etching the oxide layer using the dummy microlens as a mask.

10. The method according to claim 9, wherein etching the oxide layer using the dummy microlens as a mask comprises over-etching the oxide layer.

* * * * *